(12) United States Patent
Sakai et al.

(10) Patent No.: US 6,503,356 B1
(45) Date of Patent: Jan. 7, 2003

(54) CHIP ELEMENT HOLDER AND METHOD OF HANDLING CHIP ELEMENTS

(75) Inventors: Satoki Sakai, Takefu (JP); Jiro Todoroki, Fukui-ken (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 41 days.

(21) Appl. No.: 09/685,692

(22) Filed: Oct. 11, 2000

(30) Foreign Application Priority Data

Oct. 15, 1999 (JP) .......................................... 11-293637

(51) Int. Cl.[7] ........................ H01G 13/00; H01G 4/252; H01G 4/12
(52) U.S. Cl. ........................ 156/247; 156/280; 156/297; 29/743; 29/832; 427/123
(58) Field of Search ................................ 156/247, 249, 156/280, 297, 285; 29/743, 832; 427/123; 118/500

(56) References Cited

U.S. PATENT DOCUMENTS

| | | | | |
|---|---|---|---|---|
| 4,526,129 A | * | 7/1985 | Braden | |
| 4,561,954 A | * | 12/1985 | Scrantom et al. | |
| 4,859,498 A | * | 8/1989 | Yamaguchi | |
| 4,900,586 A | * | 2/1990 | Kanamori et al. | |
| 5,007,534 A | * | 4/1991 | Tamaki et al. | |
| 5,120,577 A | * | 6/1992 | Yamaguchi et al. | |
| 5,364,014 A | * | 11/1994 | Hamuro et al. | ......... 427/123 X |
| 5,383,997 A | | 1/1995 | Minowa et al. | |
| 5,632,813 A | * | 5/1997 | Nakagawa et al. | |
| 6,013,133 A | * | 1/2000 | Takashima et al. | |
| 6,254,715 B1 | * | 7/2001 | Okazaki et al. | ............. 156/280 |
| 2002/0014202 A1 | * | 2/2002 | Onodera et al. | |

FOREIGN PATENT DOCUMENTS

| | | | |
|---|---|---|---|
| FR | 2 501 907 | | 9/1982 |
| JP | 2-14510 | * | 1/1990 |
| JP | 2-98572 | * | 4/1990 |
| JP | 4-114886 | * | 4/1992 |
| JP | 2682250 | | 8/1997 |

* cited by examiner

Primary Examiner—Curtis Mayes
(74) Attorney, Agent, or Firm—Burns, Doane, Swecker & Mathis, LLP

(57) ABSTRACT

Exact transfer of electronic element main bodies, held by virtue of an adhesive property provided by an adhesive surface, is provided from a first holder to a second holder. A plurality of through holes are formed in the first holder, so that a pressing force provided by a pusher member can be applied through the through holes to the electronic element main bodies bonded on an adhesive surface of the first holder. Meanwhile, the first holder is separated from the electronic element main bodies which are at the same time bonded on to an adhesive surface of the second holder.

11 Claims, 4 Drawing Sheets

CHIP ELEMENT HOLDER AND METHOD OF HANDLING CHIP ELEMENTS

BACKGROUND OF THE INVENTION

1. Field of the Invention

The present invention relates to a chip element holder and a method of handling chip elements. In particular, this invention relates to a chip element holder which can be favorably used in a process of forming electrodes on the outer surfaces of chip electronic element main bodies that are referred to as chip elements here. The present invention also relates to a method of handling such chip elements.

2. Description of the Related Art

An electronic element such as a laminated type ceramic capacitor is comprised of a chip electronic main body, and a plurality of electrodes serving as terminals on both end portions of the electronic element main body. In order to form these electrodes, a paste application process is required to apply an electrically conductive paste on to each end portion of the electronic element main body. Further, in order to effectively carry out a paste application process for applying the electrically conductive paste, a great number of electronic element main bodies are needed to be aligned properly by using a holder, so that the electrically conductive paste may be simultaneously applied to a great number of electronic element main bodies.

The above mentioned holder may have various shapes or configurations. For example, Japanese Patent Gazette No. 2682250 has disclosed a holder which can be used to properly hold a plurality of electronic element main bodies, even if each of the electronic element main bodies is small, having a length of only 1.0 mm or shorter on one side of a surface on which the electrodes are to be formed. In the following, with reference to FIGS. 7A–7E, an explanation will be given to a holder made according to a prior art, and also to a method of applying the electrically conductive paste with the use of the holder.

At first, FIG. 7A is used to indicate that a chip element holder 1 is holding a plurality of chip electronic element main bodies 2 referred to as chip elements.

Here, the holder 1 as a whole is a plate member. On one of its main surfaces there are adhesively attached a plurality of electronic element main bodies 2 and thus an adhesive surface is formed in advance for holding the electronic element main bodies 2. In more detail, the holder 1 comprises a plate substrate 4 made of a rigid material such as a metal, and a holding member 5 formed by an elastomer such as a rubber which is bonded on the substrate 4. An adhesive surface 3 is formed on the surface of the holding member 5. However, the adhesive surface 3 may be replaced by the holding member 5 itself having an adhesive property, or by coating the surface of the holding member 5 with an adhesive agent.

Each of the electronic element main bodies 2 has a first end portion 6 and a second end portion 7 which form part of its outer surface and which are opposite to each other so that electrodes may be later formed on these end portions. Further, each of the electronic element main bodies 2 is held by the holder 1 under a condition in which its first end portion 6 has been bonded on the adhesive surface 3 of the holder 1.

Further, as shown in FIG. 7A, an electrically conductive paste 8 has been applied to a fixed base 9 so that a film having a predetermined thickness is formed on the fixed base 9.

Starting from a condition shown in FIG. 7A, the holder 1 is caused to move towards the fixed base 9, making the second end portion 7 of each electronic element main body 2 to be dipped into the electrically conductive paste 8.

Subsequently, the electronic element main bodies 2 are drawn up and thus the holder 1 is moved away from the electrically conductive paste 8. In this way, as shown in FIG. 7B, the electrically conductive paste 8 may be applied to the second end portion 7 of each electronic element main body 2. Afterwards, a drying treatment is carried out so as to dry the electrically conductive paste 8 coated on each element main body.

Next, a step shown in FIG. 7C is carried out. In fact, FIG. 7C shows a second holder 10 having a structure which is substantially the same as that of the above first holder 1. Although the second holder 10 has an adhesive surface 11 formed on one of its main surfaces using the same manner as used in the above first holder 1, the adhesive surface 11 is set to offer a stronger adhesion strength than an adhesion force provided by the adhesive surface 3 of the first holder 1.

As shown in FIG. 7C, when the first holder 1 and the second holder 10 are brought close to each other, the second end portion 7 of each electronic element main body 2, coated with the electrically conductive paste 8, may be bonded to the adhesive surface 11 of the second holder 10.

Then, as shown in FIG. 7D, the first holder 1 and the second holder 10 are separated from each other. At this moment, as related in the above, since an adhesion force provided by the adhesive surface 11 of the second holder 10 is set to be stronger than that provided by the adhesive surface 3 of the first holder 1, the electronic element main bodies 2 will be held on the second holder 10.

Afterwards, held by the second holder 10, the electronic element main bodies 2 are treated still further in a manner such that the first end portion 6 of each element main body is coated with the electrically conductive paste 8, using the steps which are substantially the same as those shown in FIG. 7A and FIG. 7B. In this way, as shown in FIG. 7E, it is sure that each electronic element main body 2 may be coated at its first and second end portions 6 and 7 by the electrically conductive paste 8 and that such paste coated element main bodies may be held by the second holder 10.

Next, as shown in FIG. 7E, the paste coated electronic element main bodies 2 are separated from the second holder 10. In the separation process, a knife-like tool 12 is used. Therefore, the paste coated electronic element main bodies 2 may be removed from the adhesive surface 11 by moving the knife-like tool 12 along the adhesive surface 11.

However, the holding of the electronic element main bodies 2 by either the first holder 1 or the second holder 10, has been proved to have the following problems because a holding action is effective only by means of an adhesion force provided by either the adhesive surface 3 or the adhesive surface 11.

Firstly, an adhesion force provided by either the adhesive surface 3 or the adhesive surface 11 will become deteriorated partially or entirely with the passing of time or due to a sort of pollution. For this reason, the electronic element main bodies 2 which have already been held by either the first holder 1 or the second holder 10 are likely to fall off or become inclined or get deviated from their correction positions.

Further, as fast as an adhesion force provided by the adhesive surface 3 or the adhesive surface 11 becomes deteriorated, or once the adhesion force becomes different from one position to another, it is likely that a certain kind of transferring mistake might happen during a process in which the electronic element main bodies 2 are transferred from the first holder 1 to the second holder 10 in a manner as shown in FIGS. 7C and 7D.

Moreover, transfer can only be effected in a direction from the first holder 1 to the second holder 10, i.e., rendering the electronic element main bodies to be transferred from the adhesive surface 3 having a relatively weak adhesion force to the adhesive surface 11 having a relatively strong adhesion force.

In addition, as shown in FIG. 7E, when the electronic element main bodies 2 are removed from the adhesive surface 11 using the knife-like tool 12, if the electronic element main bodies 2 are relatively firmly stuck on the adhesive surface 11, the electronic element main bodies 2 are likely to be damaged, causing cracks and notches in these element main bodies. Moreover, the use of the knife-like tool 12 can also bring about some damage to the adhesive surface 11 and pollute the same.

Further, the problems described above occur not only when handling the electronic element main bodies, but also when handling other chip elements.

SUMMARY OF THE INVENTION

Accordingly, it is an object of the present invention to provide an improved chip element holder capable of solving the above described problems, and also to provide a method of handling chip elements with the use of the improved chip element holder.

The present invention, at first, is a plate member if viewed as a whole, which is directed to a chip element holder, wherein one of its main surfaces is provided with an adhesive surface capable of bonding predetermined surfaces of a plurality of chip elements so as to hold the chip elements. In order to solve the above mentioned technical problems, the holder is so formed that it is characterized in that the holder is also provided with several through holes each having an open end which can be at least partially closed by part of the predetermined surface of one of the chip elements, so that an external force may be exerted on the predetermined outer surface of each chip element bonded on the adhesive surface.

The above external force may be a positive pressure or a negative pressure acting on the predetermined outer surfaces of the chip elements by way of the through holes. Alternatively, such an external force may be produced using a pusher member which can give a pressing force to the predetermined outer surfaces of the chip electronic elements by way of the through holes.

The above described external force can act so as to control a holding force for holding the chip elements, the holding force is obtained by virtue of an adhesion force provided by the adhesion surface. For example, if it is desired to weaken the holding force or further to separate the chip elements from the holder, the above described pressing force is applied with the use of the a positive pressure or using a pusher member. On the other hand, if it is desired to increase the holding force, a negative pressure is applied.

The present invention is also directed to a method of handling the chip elements with the use of the above described chip element holder.

The method of handling the chip elements according to the present invention, comprises the steps of preparing the chip element holder and a plurality of chip elements; bonding the predetermined outer surfaces of the chip elements on the adhesive surface of the chip element holder under a condition in which each chip element is set on a position of one through hole, thereby holding the chip elements on the holder.

In the method of handling the chip elements as described above, if it is desired to carry out a process of separating the chip elements from the holder, an external force for separating the chip elements from the chip element holder is applied to the predetermined outer surfaces of the chip elements by way of the through holes.

In the step of separating the chip elements from the chip element holder, in more detail, an external force is used as a positive pressing force produced by a pusher member. The pressing force is applied to the predetermined surfaces of the chip elements by way of the through holes. Alternatively, a positive pressure may be applied to the predetermined surfaces of the chip elements by way of the through holes.

Further, in the step of holding the chip elements on the chip element holder, if necessary, a negative pressure is used as the external force. The negative pressure is applied to the predetermined surfaces of the chip elements by way of the through holes.

When the handling method of the present invention is used as an electronic element handling method for forming electrodes on the outer surfaces of the chip element main bodies, an electrically conductive paste for forming an electrode is applied on to an outer surface which is opposite to the predetermined outer surface (bonded on the adhesive surface) of each electronic element main body. This step is carried out under a condition in which the electronic elements have been held on the holder.

When the handling method according to the present invention is used to carry out a process of transferring chip elements between two holders, necessary steps are: a) preparing, at a time when the chip element holder is used as a first chip element holder, a second chip element holder which is a different holder from the first chip element holder, the second chip element holder as a whole is a plate member, one of its main surfaces is provided with an adhesive surface capable of bonding the predetermined surfaces of a plurality of chip elements so as to hold the chip elements thereon; b) rendering the adhesive surface of the second holder to bond the chip elements being held by the first chip element holder; c) exerting an external force for separating the chip elements from the first chip element holder on the predetermined outer surfaces of the chip elements by way of the through holes, thereby enabling the chip elements to be transferred from the first holder to the second holder; and d) rendering the adhesive surface of the second holder to bond the chip elements, so as to hold the chip elements on the second holder.

When similar through holes have been formed in the second chip element holder, in the above transferring process, as related earlier, a necessary step is not to apply an external force on to the chip elements by way of the through holes formed in the first holder. Instead, what may be carried out is applying a negative pressure through the through holes formed in the second holder to keep the chip elements by virtue of a suction force, meanwhile rendering the chip elements to be transferred from the first holder to the second holder. Alternatively, what may be carried out is exerting an external force on the predetermined outer surfaces of the chip elements by way of the through holes formed in the first chip element holder, at the same time applying a negative pressure through the through holes formed in the second holder to keep the chip elements by virtue of a suction force, meanwhile rendering the chip elements to be transferred from the first holder to the second holder.

The second holder for use in the above described transferring process, is preferred to have substantially the same structure as that of the first holder.

Further, the chip element handling method including the above described transferring process, can be suitably used in a method of handling chip electronic elements, in which method the chip elements are chip electronic element main bodies each having an outer surface including mutually opposed first and second end portions on which electrodes will be formed. At this time, in a step of holding the electronic element main bodies on the first holder, the first end portion of each electronic element main body is bonded on the adhesive surface of the first holder. An electrically conductive paste forming an electrode is applied to the second end portion of each electronic element main body. The paste application is carried out under a condition in which the electronic element main bodies are held on the first holder. In a step of holding the electronic element main bodies on the second holder, the second end portion of each electronic element main body is bonded on the adhesive surface of the second holder. The second end portion has already been coated with the electrically conductive paste. An electrically conductive paste forming an electrode is applied to the first end portion of each electronic element main body. The paste application is carried out under a condition in which the electronic element main bodies are held on the second holder.

DESCRIPTION OF THE PREFERRED EMBODIMENTS

Figure 1:
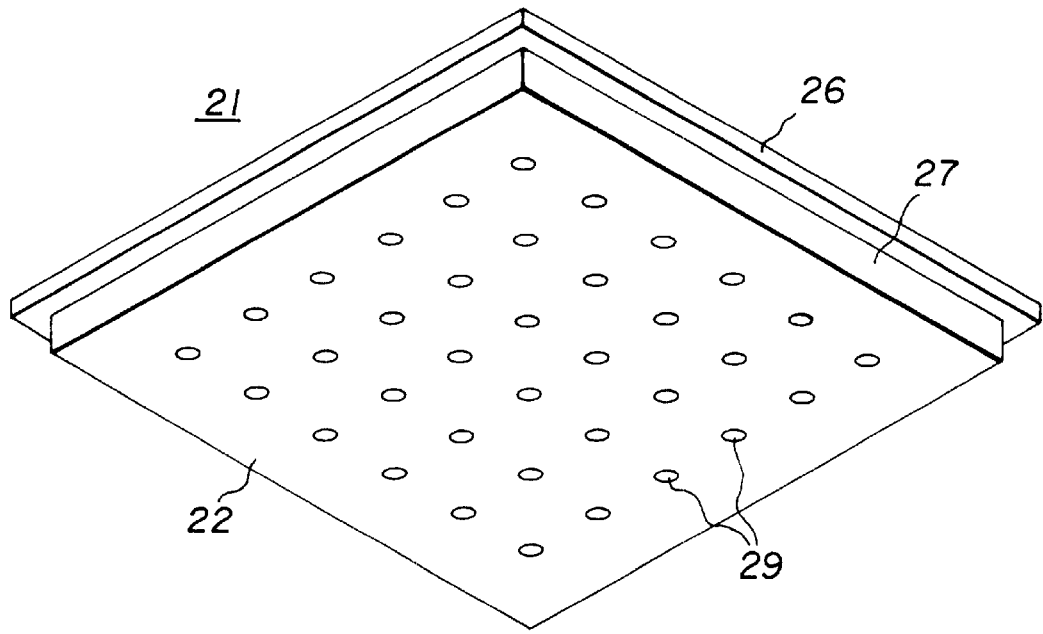
FIG. 1 is a perspective view when seen from below at an angle, schematically indicating a chip element holder 21 made according to one embodiment of the present invention.
Figure 2:
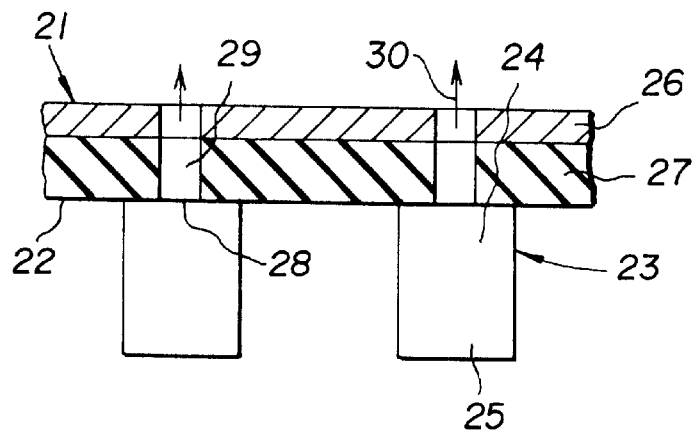
FIG. 2 is a sectional view schematically indicating a part of the holder 21 shown in FIG. 1, also showing a condition as to how the electronic element main bodies 23 are held.
Figure 3:
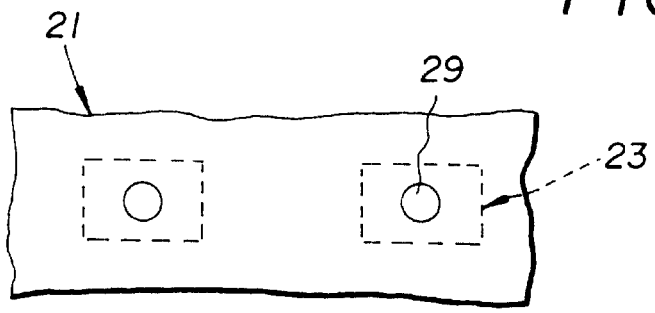
FIG. 3 is a plane view schematically indicating a part of the holder 21 shown in FIG. 1.

FIG. 1 is a view schematically indicating a chip element holder 21 made according to one embodiment of the present invention. As shown in the drawing, the holder 21 as a whole is a plate member, with one of its main surfaces being provided with an adhesive surface 22. However, the holder 21 as a whole is also allowed to be only a little like a plate, so long as a concept is that it has at least a plane adhesive surface. Further, when using the holder 21, the adhesive surface 22 may be orientated in any direction. Nevertheless, FIG. 1 is a perspective view indicating the holder 21 when viewed from below at an inclined angle, in which the adhesive surface 22 is caused to face in a downward direction. Further, FIG. 2 is a sectional view schematically indicating a part of the holder 21. FIG. 3 is a plane view also indicating a part of the holder 21. Further, in the present embodiment, although the holder 21 is indicated as an independent member, the holder 21 is also allowed to be incorporated into a manufacturing equipment or a treating apparatus, so as to be used as a treating means or a transporting means.

The adhesive surface 22, as shown in FIG. 2, is so formed that a predetermined outer surface of each of a plurality of electronic element main bodies 23 may be bonded thereon. Namely, the first end portion 24 of each element main body 23 may be bonded on to the adhesive surface 22, thereby rendering the adhesive surface 22 to hold these electronic element main bodies 23. In fact, each electronic element main body 23 has the first end portion 24 and a second end portion 25, which is opposite to the first end portion 24, so that an electrically conductive paste may be applied on to the first and second end portions so as to form electrodes thereon. However, the above mentioned electrically conductive paste is neither shown in FIG. 2 nor in other related drawings.

The holder 21 comprises a substrate plate 26 made of a rigid material such as a metal, and a holding plate 27 made of an elastomer such as a rubber. The above described adhesive surface 22 is formed on the outer surface of the holding plate 27. In practice, such an adhesive surface may be formed by the elastomer itself forming the holding plate 27, provided that the elastomer itself possesses the desired adhesion force. Alternatively, the adhesive surface may be formed by coating the holding plate with a certain kind of adhesive agent.

As a feature of the present invention, the holder 21 is formed with a plurality of through holes 29, each having an open end 28 which can be closed at least by a part of an outer surface of an electronic element main body 23, so that an external force may be applied on to a predetermined outer surface of each electronic element main body 23 bonded on the adhesive surface 22, i.e., on to the outer surface of the first end portion 24 of each element main body. Each through hole 29, as clearly shown in FIG. 3, has a circular cross section and is located at the gravitational center of an electric element main body 23 which is indicated by a broken line in the drawing.

Referring again to FIG. 2, in order that a plurality of electronic element main bodies 23 may be held by the holder 21 while at the same time aligning each element main body with a through hole 29, the holder 21 is at first arranged in a manner such that the adhesive surface 22 is caused to face in an upward direction. Then, an arranging apparatus (not shown) is placed on the adhesive surface. This arranging apparatus is used to first mount a plurality of electronic element main bodies and then guide the element main bodies to let them move to their predetermined positions on the adhesive surface 22, under a condition in which the electronic element main bodies 23 are orientated in a predetermined direction. In this way, the plurality of the electronic element main bodies 23 which have already been moved to the predetermined positions on the adhesive surface and orientated in the predetermined direction, will be pressed against the adhesive surface 22. In this manner, the plurality of electronic element main bodies 23 may be exactly bonded on to the adhesive surface 22.

However, as related in the above, when the adhesive surface 22 is formed on the surface of the holding plate 27 made of an elastomer, even if there are some size differences among the plurality of the electronic element main bodies 23, these size differences can be absorbed effectively so that the electronic element main bodies 23 are protected from being damaged, and thus the electronic element main bodies 23 can be correctly bonded on to the adhesive surface 22.

In this way, a holding condition is obtained in which the electronic element main bodies 23 can be held in a manner shown in FIG. 2. However, if a stronger holding force is desired, it is necessary to apply a negative pressure 30 through the holes 29 in a direction shown by an arrow in FIG. 2, so that the negative pressure 30 may be exerted on to the outer surfaces of the electronic element main bodies 23, i.e., on to the first end portions 24 of the element main bodies.

Figure 7A:
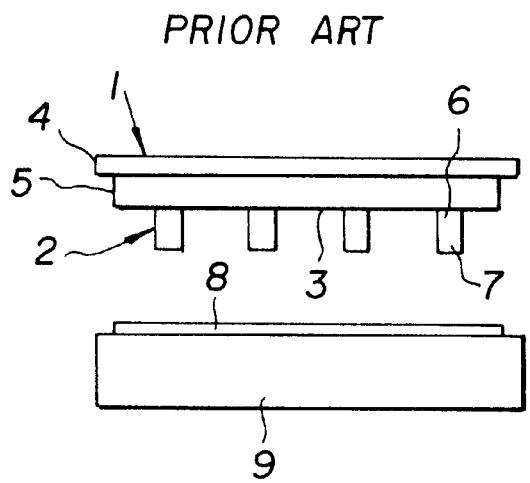
FIGS. 7A–7E provide illustrative views explaining a paste applying process for applying an electrically conductive paste 8 on to electronic element main bodies 2, using conventional chip element holders 1 and 10 related to the present invention.
Figure 7B:
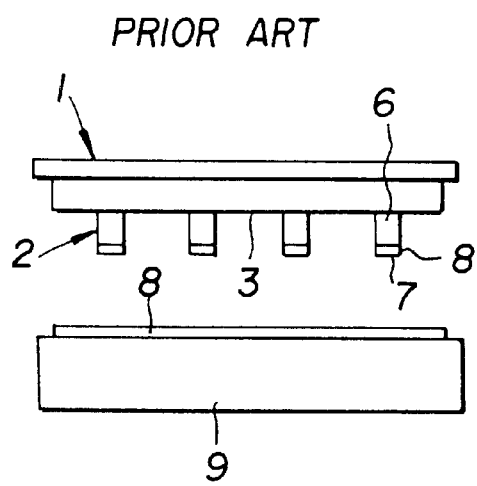
Figure 7C:
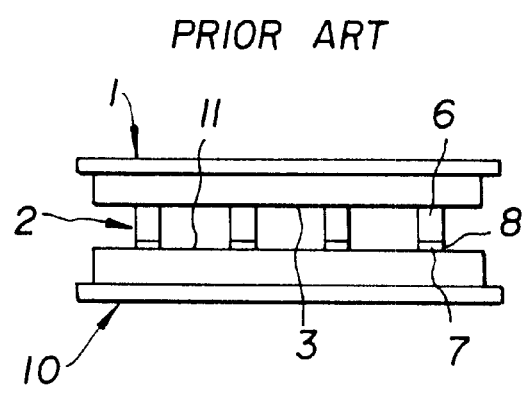
Figure 7D:
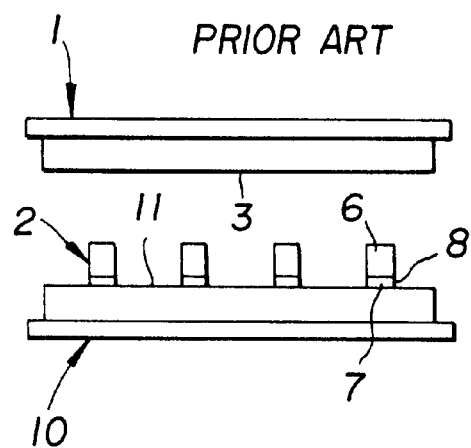

When the electronic element main bodies 23 are held by the holder 21 in a manner shown in FIG. 2, if a dipping process shown in the above FIG. 7A and FIG. 7B is carried out to dip the element main bodies 23 into the electrically conductive paste 8, the electrically conductive paste may be applied to the second end portion 25 of each element main body 23. Then, with the electronic element main bodies 23 held by the holder 21, the electrically conductive paste is dried.

Further, when the electrically conductive paste is to be applied also to the first end portion 24 of each electronic element main body 23, a process is needed to carry out a transferring operation shown in FIG. 4. For this reason, when the above holder 21 is used as a first holder, it is necessary to prepare a second holder 31 for holding the chip elements. In fact, the second holder 31 has substantially the same structure as that of the first holder 21, with one of its main surfaces being provided with an adhesive surface 32.

Figure 4A:
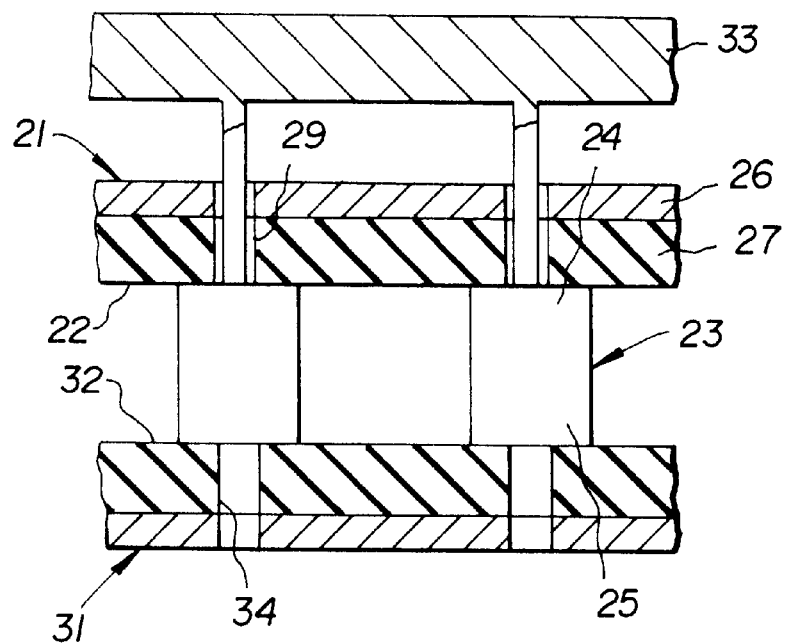
FIGS. 4A–4B provide sectional views schematically indicating a transferring process for transferring electronic element main bodies 23, using a first holder 21 shown in FIG. 1 and a second holder 31.

As shown in FIG. 4A, the first holder 21 holding a plurality of electronic element main bodies 23 is moved towards the second holder 31, so that the second end portion 25 coated with the electrically conductive paste (not shown) partly forming an electronic element may be bonded to the adhesive surface 32 of the second holder 31. At this moment, each electronic element main body 23 is pressed by a predetermined pressing force against the adhesive surface 32, thereby obtaining an exactly bonded state.

Further, a pusher member 33 is prepared which is used to exert a pressing force on the outer surface of the first end portion 24 of each electronic element main body 23, by way of the through holes formed in the first holder 21. By letting the legs of the pusher member 33 be inserted into the through holes 29, an external force is applied to the outer surface of each electronic element main body 23. The external force causes the electronic element main bodies 23 to be separated from the first holder 21.

Figure 4B:
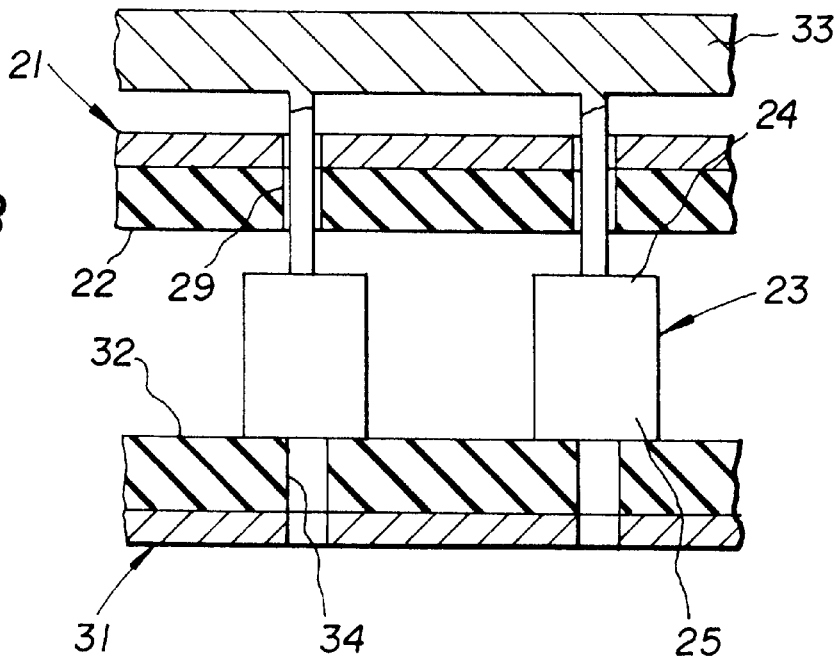

Then, as shown in FIG. 4B, under a condition that the pressing action produced by the pusher member 33 is maintained, the first holder 21 is separated from the second holder 31, thereby enabling the electronic element main bodies 23 to be transferred from the first holder 21 to the second holder 31.

Subsequently, with the electronic element main bodies 23 being held by the second holder 31, the first end portion 24 of each of the electronic element main bodies 23 is coated with the electrically conductive paste (not shown), followed by a drying treatment, using substantially the same processes as shown in FIG. 7A and FIG. 7B.

After that, the electronic element main bodies 23 are removed from the second holder 31.

Figure 7E:
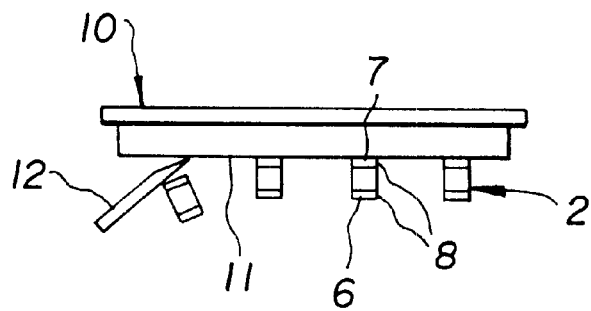

As shown in FIGS. 4A–4B, it is preferred that the second holder 31 is also formed with a plurality of through holes 34. These through holes 34 are just the same as the through holes 29 formed in the first holder 21, and are effective in increasing a holding force for holding the electronic element main bodies 23 if a negative pressure is applied in the same manner as described above. On the other hand, if a positive pressure is applied into the through holes 34, a holding force for holding the electronic element main bodies 23 will be weakened. By weakening the holding strength, it may be made easier to separate the electronic element main bodies 23 from the second holder 31. If necessary, a knife-like tool 12 is used in a manner shown in FIG. 7E, so as to remove the electronic element main bodies 23 from the adhesive surface 32 with only a reduced acting force.

Moreover, when the electronic element main bodies 23 are to be removed from the second holder 31, it is also allowed to use a pusher member 33 shown in FIGS. 4A–4B. Namely, legs of the pusher member are inserted into the through holes 34, so that a pressing force produced by the pusher member 33 may be exerted on the outer surfaces of the electronic element main bodies 23 by way of the through holes 34.

Further, in the transferring process shown in FIGS. 4A–4B, rather than using the pusher member 33, a positive pressure may be applied through the through holes 29 formed in the first holder 21, so as to weaken the adhesion force produced by the adhesive surface of the first holder 21 holding the electronic element main bodies 23. Alternatively, a negative pressure may be applied through the through holes 34 formed in the second holder 31, so as to remove the electronic element main bodies 23 from the first holder 21. In addition, it is also possible to simultaneously use the pusher member 33, the positive pressure and the negative pressure, so as to complete the desired transfer.

Figure 5:
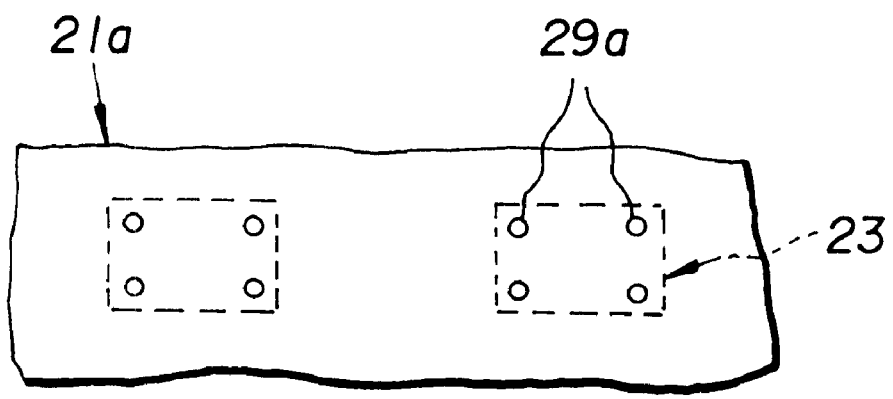
FIG. 5 is a view corresponding to FIG. 3, schematically indicating a holder 21a made according to another embodiment of the present invention.
Figure 6:
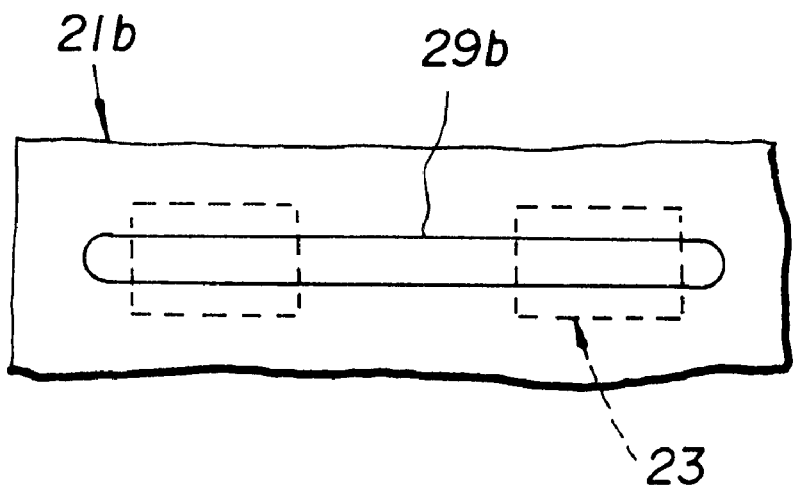
FIG. 6 is a view corresponding to FIG. 3, schematically indicating a holder 21b made according to a further embodiment of the present invention.

FIG. 5 and FIG. 6 are views corresponding to FIG. 3, which are used to describe other embodiments of the present invention.

In an embodiment shown in FIG. 5, a further holder 21a is formed with a plurality of through holes 29a, in a manner such that several through holes, such as four through holes, correspond to one electronic element main body 23.

In an embodiment shown in FIG. 6, a still further holder 21b is formed with a plurality of through holes 29b, in a manner such that one through hole 29b corresponds to several electronic element main bodies such as two electronic element main bodies 23.

As may be understood through a comparison among FIG. 3, FIG. 5 and FIG. 6, the through holes 29, 29a and 29b are useful not only for reducing contact areas between the electronic element main bodies 23 and the adhesive surface 22, but also for controlling such contact areas. Namely, in a process of forming desired through holes 29, 29a and 29b, it is possible to change the contact areas between the electronic element main bodies 23 and the adhesive surface, by changing the sectional shapes, sectional areas and number of the through holes. As a result, the holding force provided by the adhesion strength for holding the electronic element main bodies 23 is controlled.

Although the present invention has been described with the use of several illustrated embodiments, the scope of the present invention is also allowed to cover various other embodiments.

For example, in order to form electrodes on the first end portion 24 and the second end portion 25 of each electronic element main body 23, although an electrically conductive paste may be applied to each element main body, other methods such as a plating method may be used.

Further, the present invention is also suitable for use when the electrode is formed only on one end portion 24 of the two end portions of each electronic element main body 23. In such a case, there is no need to carry out the transferring process shown in FIG. 4.

Moreover, the handling method according to the present invention can be suitably used not only for forming electrodes on the outer surfaces of the electronic element main bodies 23, but also for treatments other than the formation of electrodes. For instance, the handling method may be used for carrying out an examination for examining the characteristics of various electronic elements, or for attaching various indications on the surfaces of the electronic elements. Further, the present invention can also be suitably used for handling chip elements other than electronic elements.

In this way, with the use of the chip element holder made according to the present invention, chip elements may be held on an adhesive surface by being bonded thereon, and through holes are formed through the holder, an open end of each through hole is at least partially closed by a predetermined outer surface of one of the chip elements. Therefore, an external force may be applied to the predetermined surfaces of the chip elements bonded on the adhesive surface, by way of the through holes. As a result, it is possible to control a holding force for holding the chip elements.

For this reason, with the use of the chip element handling method according to the present invention employing the above described chip element holder, if the chip elements are held on the holder and a negative pressure is applied to the predetermined outer surfaces of the chip elements by way of the through holes, it is possible to increase a holding force for holding the chip elements, thus making it possible to effectively prevent the chip elements from falling off, becoming inclined and being dislocated. Further, if a positive pressure is applied to the predetermined outer surfaces of the chip elements by way of the through holes, and if a pressing force produced by a pusher member is used, separating the chip elements from the holder becomes easy.

Therefore, even if a knife-like tool is not used, it is still possible to remove the chip elements from the holder. Meanwhile, if a knife-like tool is used, only a very small force is needed to remove the chip elements from the holder. Thus, the chip elements are effectively prevented from being damaged and the adhesive surface is prevented from being broken.

Moreover, when the chip elements are transferred from the first holder to the second holder, if a positive pressure or a pressing force produced by a pusher member is applied from the first holder side, alternatively if a suction force is applied from the second holder side, the chip elements may be transferred exactly and smoothly. In such a case, it is not necessary to have a difference between adhesion forces of the adhesive faces of the first and second holders. In addition, even if an adhesion force of the adhesive surface of the first holder is larger than an adhesion force of the adhesive surface of the second holder, it is still possible to carry out a transferring process without strictly monitoring the adhesion forces of the adhesive surfaces, thereby making it possible to simplify the management of the manufacturing process.

Further, with the use of the through holes formed in the holder, it is easy to confirm, by means of a light or a pressure, whether or not the chip elements have been held in a correct manner.

In view of the above, the chip element holder and the chip element handling method can be particularly effectively used in applying an electrically conductive paste so as to form electrodes on the mutually opposite first and second end portions of a plurality of the chip electronic element main bodies.

The present invention is not limited to the above-described embodiments and can be variously modified within the scope set forth in the appended claims.

What is claimed is:

1. A method of handling chip elements, wherein said method is associated with the use of a chip element holder, said holder as a whole is a plate member, one of its main surfaces is provided with an adhesive surface capable of bonding predetermined surfaces of a plurality of chip elements so as to hold the chip elements on top of the main surface, said method comprising the steps of:

providing said holder with several through holes, each through hole having an open end which can be at least partially closed by part of the predetermined surface of one of the chip elements, so that an external force may be exerted on predetermined outer surfaces of the chip elements bonded on the adhesive surface;

preparing the chip element holder and a plurality of chip elements;

bonding the predetermined outer surfaces of the chip elements on the adhesive surface of the chip element holder under a condition in which each chip element is set on a position aligned with one through hole; and holding the chip elements on the chip element holder, wherein the external force is produced by a pressing force to the predetermined outer surfaces of the chip elements by way of the through holes, therein enabling the chip elements to be separated from the chip element holder.

2. The method of handling chip elements according to claim 1, wherein said method further includes a step of exerting an external force, for separating the chip elements from the chip element holder, on the predetermined outer surfaces of the chip elements by way of the through holes, thereby enabling the chip elements to be separated from the chip element holder.

3. The method of handling chip elements according to claim 2, wherein the step of separating the chip elements from the chip element holder uses, as an external force, a pressing force produced by a pusher member, said pressing force being applied to the predetermined outer surfaces of the chip elements by way of the through holes.

4. The method of handling chip elements according to claim 2, wherein the step of separating the chip elements from the chip element holder uses as the external force a positive pressure, said positive pressure being applied to the predetermined outer surfaces of the chip elements by way of the through holes.

5. The method of handling chip elements according to claim 1, wherein the step of holding the chip elements on the chip element holder uses as the external force a negative pressure, said negative pressure being applied to the predetermined outer surfaces of the chip elements by way of the through holes.

6. The method of handling chip elements according to claim 1, wherein the chip elements are chip electronic element main bodies, the outer surfaces of which are going to have electrodes to be formed thereon, said method further comprises a step of applying an electrically conductive paste for forming an electrode on to an outer surface which is opposite to a predetermined outer surface of each electronic element main body, with said step being carried out under a condition in which the electronic elements have been held on the chip element holder.

7. The method of handling chip elements according to claim 1, further comprising the steps of:

preparing, at a time when said chip element holder is used as a first chip element holder, a second chip element holder which is a different one from the first chip element holder, said second chip element holder as a whole is a plate member, one of its main surfaces is provided with an adhesive surface capable of bonding the predetermined surfaces of a plurality of chip elements so as to hold the chip elements;

rendering the adhesive surface of the second chip element holder to bond the chip elements being held by the first chip element holder;

exerting an external force for separating the chip elements from the first chip element holder on the predetermined outer surfaces of the chip elements by way of the through holes, thereby enabling the chip elements to be transferred from the first chip element holder to the second chip element holder; and rendering the adhesive surface of the second chip element holder to bond the chip elements, so as to hold the chip elements on the second chip element holder.

8. The method of handling chip elements according to claim 1, further comprising the steps of:

preparing, at a time when said chip element holder is used as a first chip element holder, a second chip element holder which is a different one from the first chip element holder, said second chip element holder as a whole is a plate member, one of its main surfaces is provided with an adhesive surface capable of bonding the predetermined surfaces of a plurality of chip elements so as to hold the chip elements, said holder is also provided with several through holes each having an open end which can be at least partially closed by part of the predetermined surface of one of the chip elements, so that an external force may be exerted on the predetermined outer surfaces of the chip elements bonded on the adhesive surface;

rendering the adhesive surface of the second chip element holder to bond the chip elements being held by the first chip element holder;

applying a negative pressure through the through holes formed in the second chip element holder to keep the chip elements by virtue of a suction force, meanwhile rendering the chip elements to be transferred from the first chip element holder to the second chip element holder; and rendering the adhesive surface of the second chip element holder to bond the chip elements, so as to hold the chip elements on the second chip element holder.

9. The method of handling chip elements according to claim 1, further comprising the steps of:

preparing, at a time when said chip element holder is used as a first chip element holder, a second chip element holder which is a different one from the first chip element holder, said second chip element holder as a whole is a plate member, one of its main surfaces is provided with an adhesive surface capable of bonding the predetermined surfaces of a plurality of chip elements so as to hold the chip elements, said holder is also provided with several through holes each having an open end which can be at least partially closed by part of the predetermined surface of one of the chip elements, so that an external force may be exerted on the predetermined outer surfaces of the chip elements bonded on the adhesive surface;

rendering the adhesive surface of the second element holder to bond the chip elements being held by the first chip element holder;

exerting an external-force for separating the chip elements from the first chip element holder on the predetermined outer surfaces of the chip elements by way of the through holes formed in the first chip element holder, at the same time applying a negative pressure through the through holes formed in the second chip element holder to keep the chip elements by virtue of a suction force, meanwhile rendering the chip elements to be transferred from the first chip element holder to the second chip element holder; and rendering the adhesive surface of the second chip element holder to bond the chip elements, so as to hold the chip elements on the second chip element holder.

10. The method of handling chip elements according to any one of claims 7 to 9, wherein the second chip element holder has a structure which is substantially the same as that of the first chip element holder.

11. The method of handling chip elements according to any one of claims 7 to 9, wherein the chip elements are chip electronic element main bodies each having an outer surface including mutually opposed a first end portion and a second end portion on which electrodes are formed, said method further comprising the steps of:

holding the electronic element main bodies on the first chip element holder, bonding the first end portion of each electronic element main body on the adhesive surface of the first chip element holder;

applying an electrically conductive paste forming an electrode to the second end portion of each electronic element main body, said paste application being carried out under a condition in which the electronic element main bodies are held on the first chip element holder;

bonding, in a process of holding the electronic element main bodies on the second chip element holder, the second end portion of each electronic element main body on the adhesive surface of the second chip element holder, said second end portion having already been coated with the electrically conductive paste; and applying an electrically conductive paste forming an electrode to the first end portion of each electronic element main body, said paste application being carried out under a condition in which the electronic element main bodies are held on the second chip element holder.

* * * * *